(12) United States Patent
Wu et al.

(10) Patent No.: US 11,024,581 B2
(45) Date of Patent: Jun. 1, 2021

(54) SEMICONDUCTOR PACKAGES AND METHODS OF MANUFACTURING THE SAME

(71) Applicant: Taiwan Semiconductor Manufacturing Co., Ltd., Hsinchu (TW)

(72) Inventors: Yi-Wen Wu, Taipei County (TW); Hung-Jui Kuo, Hsinchu (TW); Ming-Che Ho, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 16 days.

(21) Appl. No.: 16/283,836

(22) Filed: Feb. 25, 2019

(65) Prior Publication Data
US 2020/0273805 A1   Aug. 27, 2020

(51) Int. Cl.
| H01L 23/532 | (2006.01) |
| H01L 23/31 | (2006.01) |
| H01L 23/522 | (2006.01) |
| H01L 23/00 | (2006.01) |
| H01L 21/768 | (2006.01) |

(52) U.S. Cl.
CPC .. *H01L 23/53238* (2013.01); *H01L 21/76802* (2013.01); *H01L 21/76873* (2013.01); *H01L 23/3114* (2013.01); *H01L 23/3128* (2013.01); *H01L 23/5226* (2013.01); *H01L 24/09* (2013.01); *H01L 24/17* (2013.01); *H01L 2224/02379* (2013.01); *H01L 2224/02381* (2013.01); *H01L 2224/0401* (2013.01)

(58) Field of Classification Search
CPC ........... H01L 23/53238; H01L 23/3114; H01L 23/5226; H01L 23/3128; H01L 21/76873; H01L 21/76802; H01L 24/17; H01L 24/09; H01L 2224/0401; H01L 2224/02379; H01L 2224/02381
See application file for complete search history.

(56) References Cited

U.S. PATENT DOCUMENTS

| 6,518,092 | B2 * | 2/2003 | Kikuchi | ............ H01L 21/76801 438/107 |
| 9,000,584 | B2 | 4/2015 | Lin et al. | |
| 9,048,222 | B2 | 6/2015 | Hung et al. | |
| 9,048,233 | B2 | 6/2015 | Wu et al. | |
| 9,064,879 | B2 | 6/2015 | Hung et al. | |
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,368,460 | B2 | 6/2016 | Yu et al. | |
| 9,372,206 | B2 | 6/2016 | Wu et al. | |
| 9,496,189 | B2 | 11/2016 | Yu et al. | |

(Continued)

*Primary Examiner* — Sitaramarao S Yechuri
(74) *Attorney, Agent, or Firm* — JCIPRNET

(57) ABSTRACT

Semiconductor packages and methods of forming the same are disclosed. One of the semiconductor packages includes a first dielectric layer, a first conductive pattern and a barrier layer. The first conductive pattern is disposed in a second dielectric layer over the first dielectric layer. The barrier layer is disposed at an interface between the first conductive pattern and the second dielectric layer and an interface between the first dielectric layer and the second dielectric layer.

20 Claims, 17 Drawing Sheets

(56) References Cited

U.S. PATENT DOCUMENTS

| | | | | |
|---|---|---|---|---|
| 2003/0183940 | A1* | 10/2003 | Noguchi | H01L 21/76801 257/767 |
| 2013/0260552 | A1* | 10/2013 | Chou | H01L 23/5329 438/627 |
| 2015/0249009 | A1* | 9/2015 | Tapily | C23C 16/45525 438/585 |
| 2016/0211216 | A1* | 7/2016 | Xu | H01L 21/76831 |

* cited by examiner

SEMICONDUCTOR PACKAGES AND METHODS OF MANUFACTURING THE SAME

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of types of semiconductor packages include quad flat packages (QFP), pin grid array (PGA) packages, ball grid array (BGA) packages, flip chips (FC), three-dimensional integrated circuits (3DICs), wafer level packages (WLPs), and package on package (PoP) devices, etc. Although existing semiconductor packages have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIGS. 1A-1J are schematic cross-sectional views illustrating a method of manufacturing a semiconductor package in accordance with some embodiments of the disclosure.

DETAILED DESCRIPTION

Figure 1A:
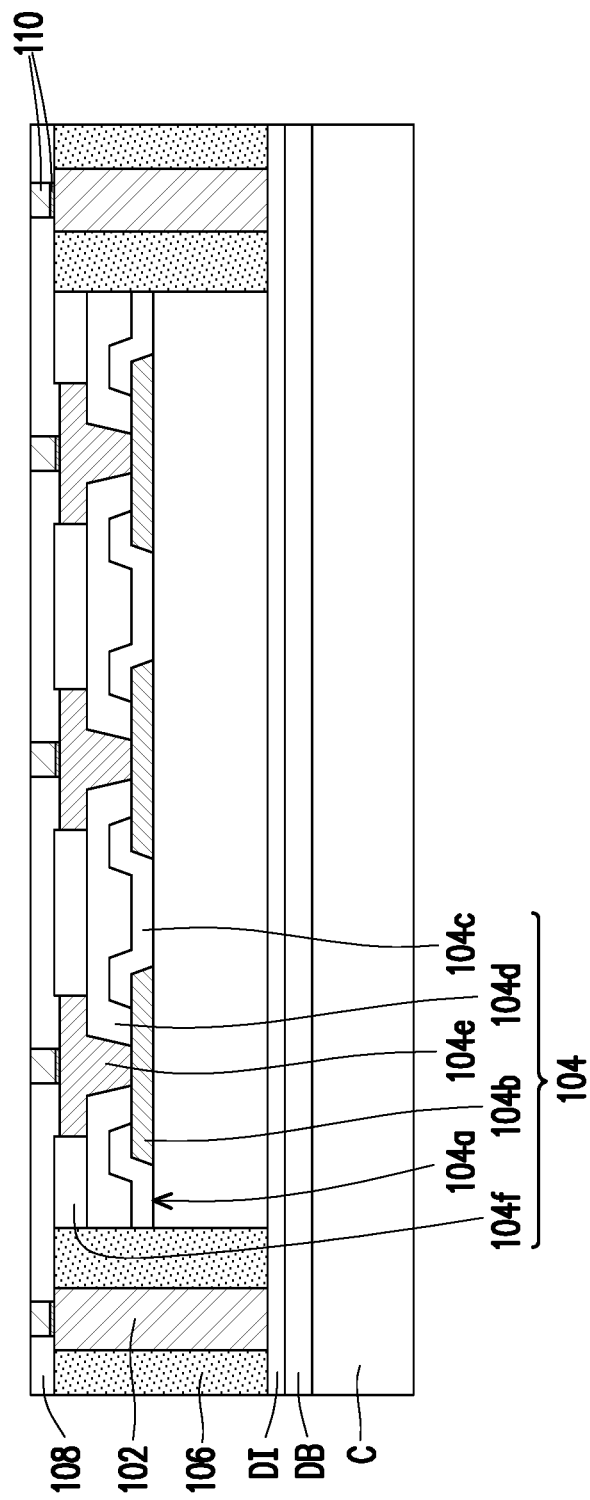

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending over the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1J are schematic cross-sectional views illustrating a method of manufacturing a semiconductor package in accordance with some embodiments of the disclosure. Referring to FIG. 1A, a carrier C is provided. A de-bonding layer DB and a dielectric layer DI are stacked over the carrier C in sequential order. In some embodiments, the de-bonding layer DB is formed on the upper surface of the carrier C, and the de-bonding layer DB is between the carrier C and the dielectric layer DI. The carrier C is, for example, a glass substrate. On the other hand, in some embodiments, the de-bonding layer DB is a light-to heat-conversion (LTHC) release layer formed on the glass substrate. In some embodiments, the dielectric layer DI is, for example, polymer such as polyimide, benzocyclobutene (BCB), polybenzoxazole (PBO), or the like. In some alternative embodiments, the dielectric layer DI may include non-organic dielectric materials such as silicon oxide, silicon nitride, silicon carbide, silicon oxynitride, or the like. However, the materials of the de-bonding layer DB, the carrier C, and the dielectric layer DI are merely for illustration, and the disclosure is not limited thereto.

A plurality of pre-fabricated conductive posts 102 are provided over the dielectric layer DI. A pre-fabricated die 104 is mounted onto the dielectric layer DI having the conductive posts 102 formed thereon. In some alternative embodiments, a die attach film may be located between the die 104 and the dielectric layer DI for adhering the die 104 onto the dielectric layer DI. The die 104 is surrounded by the conductive posts 102. The die 104 is, for example, a semiconductor die. The die 104 includes an active surface 104*a*, a plurality of pads 104*b* distributed on the active surface 104*a*, at least one dielectric layer 104*c*, 104*d* covering the active surface 104*a*, a plurality of conductive patterns 104*e*, and a protection layer 104*f*. The pads 104*b* are partially exposed by the dielectric layers 104*c*, 104*d*. In some embodiments, the dielectric layer 104*c* is conformally formed over the pads 104*b* and has a plurality of openings to expose the pads 104*b* respectively. In some embodiments, the dielectric layer 104*d* is formed on the dielectric layer 104*c* and partially filled into the openings of the dielectric layer 104c, and the dielectric layer 104d has a plurality of openings to expose the pads 104b respectively. In other words, the openings of the dielectric layer 104d are disposed in the openings of the dielectric layer 104c respectively. The dielectric layer 104c covers edge portions of the pads 104b, and the dielectric layer 104d covers the dielectric layer 104c and portions of the pads 104c exposed by the openings of the dielectric layer 104c. The conductive patterns 104e are partially disposed in the openings of the dielectric layer 104d and partially disposed on the top surface of the dielectric layer 104d. In some embodiments, the protection layer 104f is formed on the dielectric layer 104d and the conductive patterns 104e and exposes the conductive patterns 104e. In some embodiments, the conductive pattern 104e includes a via and a conductive line, the via is disposed in the opening of the dielectric layer 104d, and the conductive line is disposed on the dielectric layer 104d and electrically connected to the via, for example. However, in some alternative embodiments, the conductive pattern 104e may be a conductive pillar. In some embodiments, the top surfaces of the conductive patterns 104e may be lower than the top surface of the protection layer 104f, for example. However, in some alternative embodiments, the top surfaces of the conductive patterns 104e may be substantially flush with the top surface of the protection layer 104f. In some embodiments, a material of the protection layer 104f may be a polybenzoxazole (PBO) layer, a polyimide (PI) layer or other suitable polymers. In some alternative embodiments, the protection layer 104f may be made of an inorganic material.

In some embodiments, an encapsulant 106 is formed on the dielectric layer DI to encapsulate the conductive posts 102 and the die 104. In some embodiments, the encapsulant 106 is a molding compound formed by a molding process. In some alternative embodiments, the encapsulant 106 may include epoxy or other suitable materials. The encapsulant 106 encapsulates the sidewall of the die 104, and the encapsulant 106 is penetrated by the conductive posts 102. In other words, the die 104 and the conductive posts 102 are embedded in the encapsulant 106. It should be noted that although the die 104 and the conductive posts 102 are embedded in the encapsulant 106, the encapsulant 106 exposes the top surfaces of the die 104 and the conductive posts 102. In some embodiments, the top surfaces of the conductive posts 102 and the top surface of the protection layer 104f are substantially coplanar with the top surface of the encapsulant 106. However, in some alternative embodiments, the top surfaces of the conductive patterns 104e may be also substantially flush with the top surfaces of the protection layer 104f and the encapsulant 106.

After forming the passivation layer 104f and the encapsulant 106, a redistribution circuit structure is formed over the die 104 and the conductive posts 102 to electrically connect the die 104 and the conductive posts 102. In some embodiments, first, as shown in FIG. 1A, a dielectric layer 108 is formed over the conductive posts 102, the die 104 and the encapsulant 106, and a plurality of vias 110 are formed in the dielectric layer 108 to electrically connect to the conductive posts 102 and the die 104. In some embodiments, the dielectric layer 108 is formed over the top surfaces of the conductive posts 102, the encapsulant 106, the conductive patterns 104e, and the protection layer 104f, and has a plurality of openings to expose portions of the conductive patterns 104e respectively. In some embodiments, the vias 110 are formed in the openings of the dielectric layer 108 to electrically connect to the conductive patterns 104e respectively. In some embodiments, the top surfaces of the vias 110 are substantially flush with the top surface of the dielectric layer 108, for example. In some embodiments, the via 110 includes a seed layer pattern and a conductive pattern on the seed layer pattern, for example. In some embodiments, the dielectric layer 108 may be served as the bottommost dielectric layer of the redistribution circuit structure, and the vias 110 may be served as the bottommost redistribution patterns of the redistribution circuit structure, for example. Then, a plurality of conductive patterns CP (shown in FIG. 1H) serving as the redistribution patterns are sequentially formed over the die 104 to electrically connect the die 104 through the vias 110.

Figure 1B:
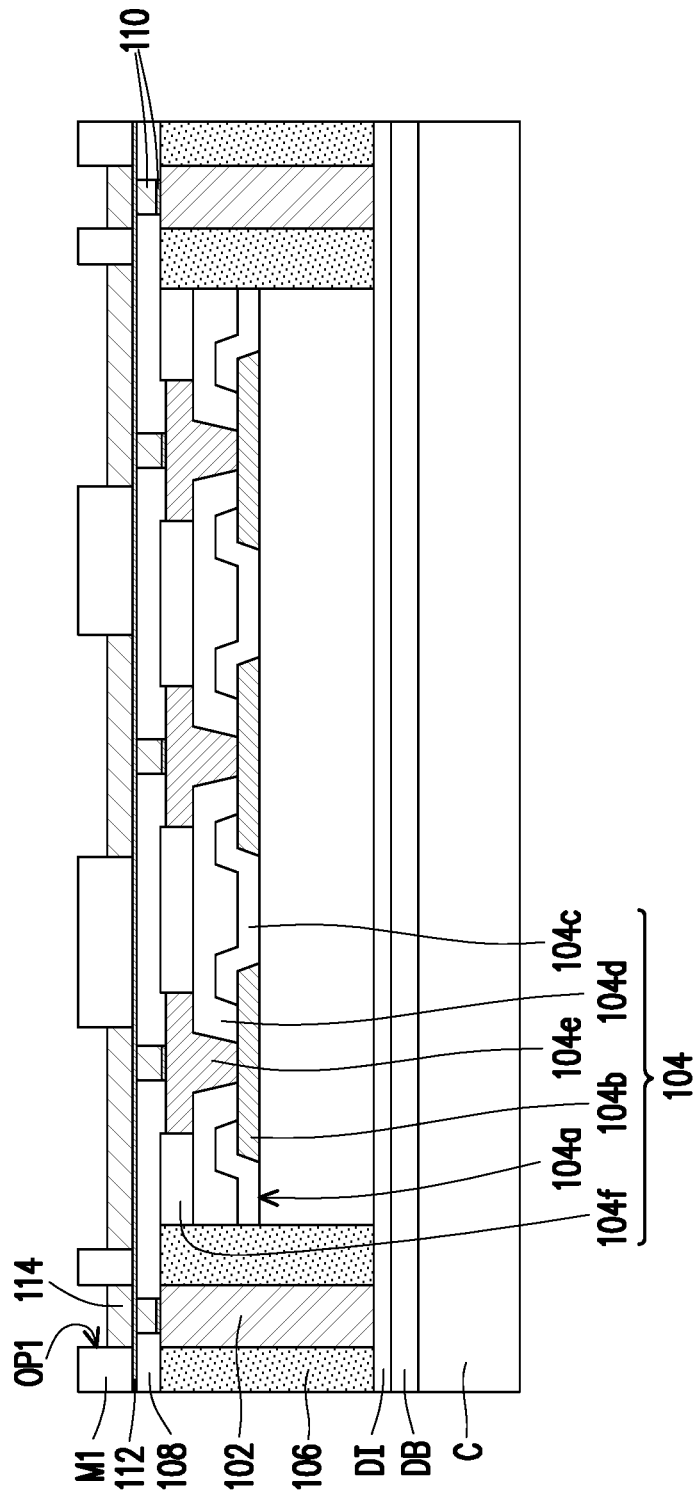

FIGS. 1B to 1G describe a method of forming a conductive pattern partially covered with a barrier layer, and the conductive pattern may be any one redistribution pattern of the redistribution circuit structure. Referring to FIG. 1B, first, a seed layer 112 is formed over the vias 110. In some embodiments, the seed layer 112 is blanket formed over the top surfaces of the vias 110 and the dielectric layer 108. In some embodiments, the seed layer 112 is in contact with the top surfaces of the vias 110 and the dielectric layer 108. In some embodiments, a material of the seed layer 112 may include, for example, copper, copper alloys, or other suitable choice of materials. In some embodiments, the seed layer 112 is formed by a sputtering method, a deposition method such as physical vapor deposition or other applicable methods. In some embodiments, the seed layer 112 may have a thickness of approximately 0.01 μm to approximately 1 μm, for example.

Then, a mask M1 may be formed over the seed layer 112, and the mask M1 has a plurality of openings OP1 corresponding to the vias 110. In some embodiments, the openings OP1 are disposed directly over the vias 110, for example. In some embodiments, a width of the opening OP1 ranges from 1 μm to 5 μm, for example. A conductive material 114 is partially filled into the openings OP1 of the mask M1. In some embodiments, the top surface of the conductive material 114 is lower than the top surface of the mask M1, for example. However, in some alternative embodiments, the top surface of the conductive material 114 may be substantially coplanar with the top surface of the mask M1. In some embodiments, the conductive material 114 may be formed by a plating process. The plating process is, for example, electro-plating, electroless-plating, immersion plating, or the like. The conductive material 114 is, for example, copper, copper alloys, or the like. In some embodiments, the seed layer 112 and the conductive material 114 include the same material. For example, the seed layer 112 and the conductive material 114 are made of the same material.

Figure 1C:
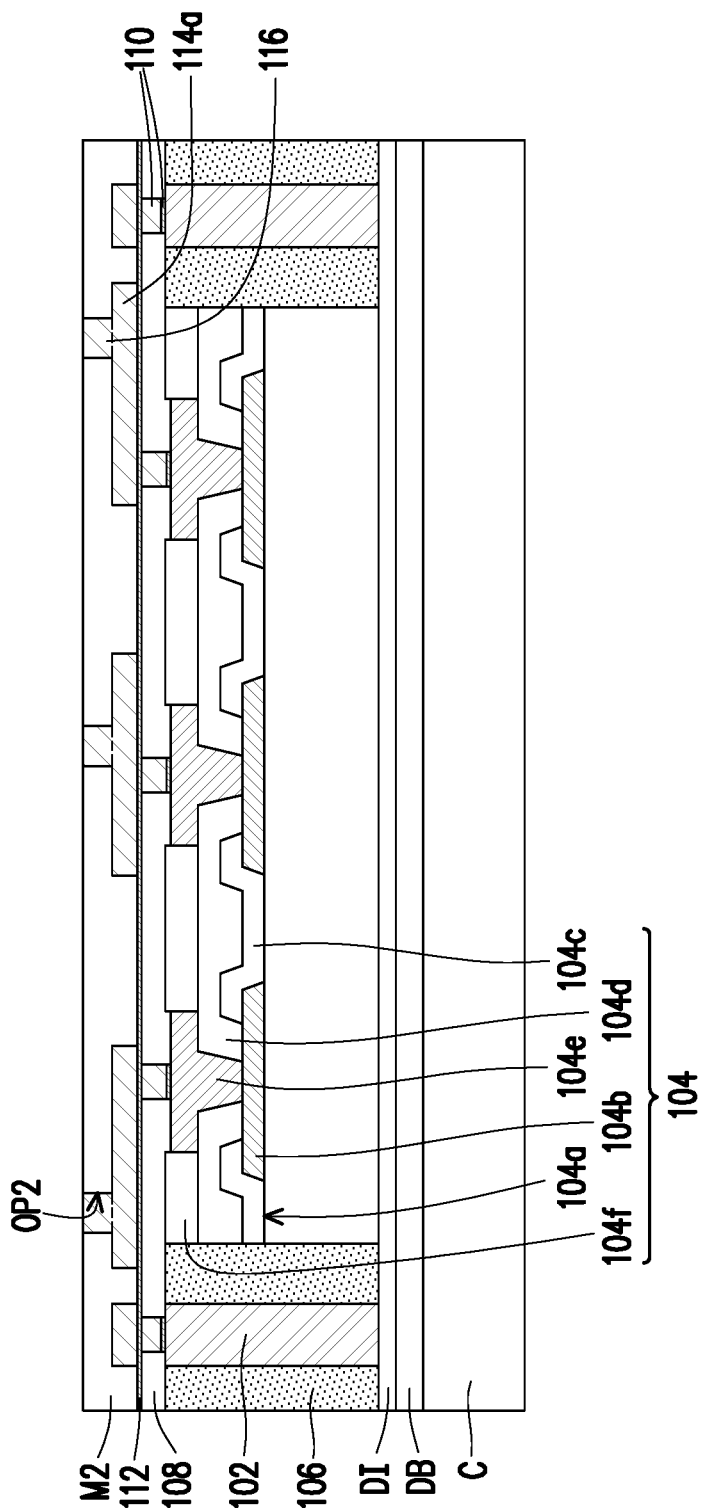

Referring to FIG. 1C, the mask M1 is subsequently removed to render a plurality of conductive lines 114a, and portions of the seed layer 112 are exposed. In some embodiments, the mask M1 is removed by a stripping process, for example. Portions of the seed layer 112 are covered by the conductive lines 114a, and portions of the seed layer 112 between the conductive lines 114a are exposed. After that, a mask M2 is formed over the seed layer 112 and the conductive lines 114a. In some embodiments, the mask M2 has a plurality of openings OP2 to expose portions of the conductive lines 114a respectively. In some embodiments, a width of the openings OP2 is smaller than a width of the opening OP1. Then, a conductive material 116 is partially filled into the openings OP2 of the mask M2. In some embodiments, the top surface of the conductive material 116 is substantially coplanar with the top surface of the mask M2, for example. In some embodiments, the conductive material 116 may be formed by a plating process. The plating process is, for example, electro-plating, electroless-plating, immersion plating, or the like. The conductive material 116 is, for example, copper, copper alloys, or the like. In some embodiments, the seed layer 112, the conductive lines 114*a* and the conductive material 116 may include the same material. For example, the seed layer 112, the conductive lines 114*a* and the conductive material 116 are made of the same material.

Figure 1D:
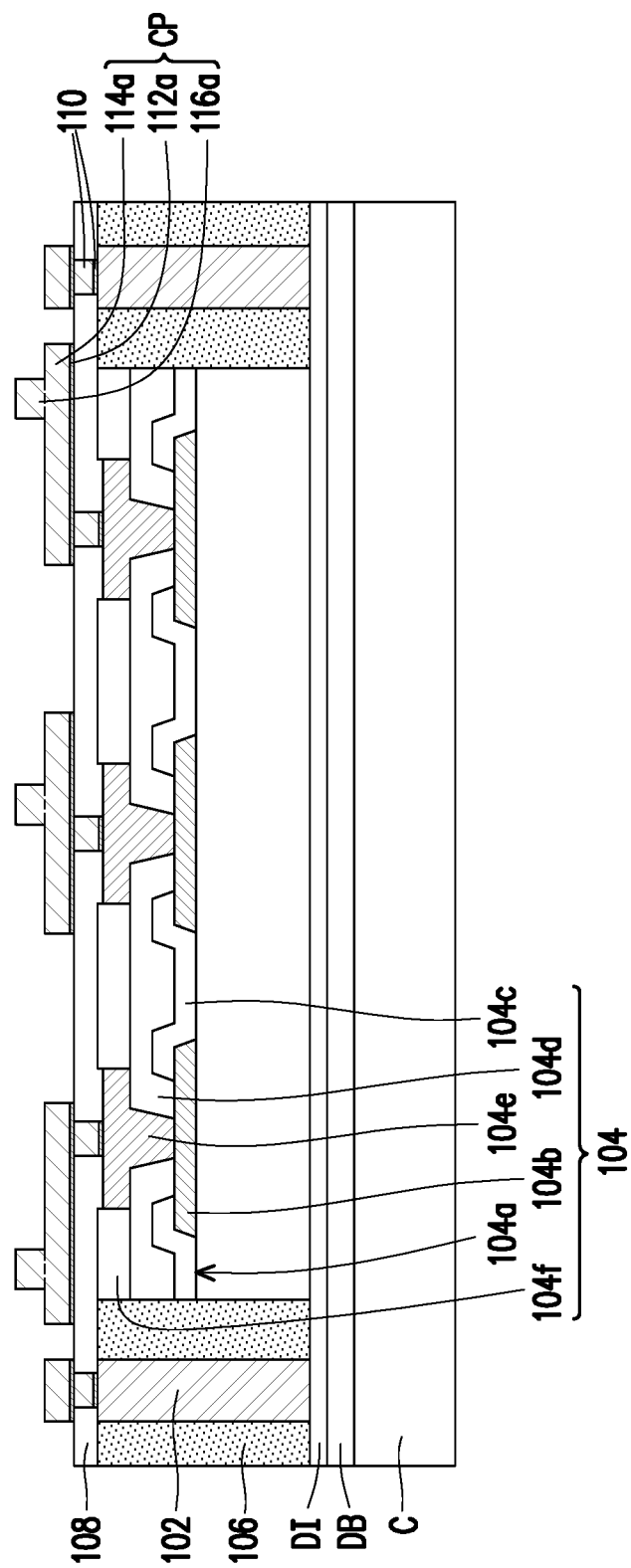

Referring to FIG. 1D, then, the mask M2 is subsequently removed to render a plurality of vias 116*a*, and the seed layer 112 is patterned to form a plurality of seed layer patterns 112*a*. In some embodiments, the mask M2 is removed by a stripping process, for example. After removing the mask M2, by using the vias 116*a* as the mask, the seed layer 112 is patterned to form the seed layer patterns 112*a*, and a plurality of conductive patterns CP are formed. In some embodiments, the seed layer 112 may be partially removed by an etching process. In some embodiments, the conductive pattern CP includes the seed layer pattern 112*a*, the conductive line 114*a* and the via 116*a* sequentially formed over the dielectric layer 108, and the conductive pattern CP is electrically connected to the pad 104*b* of the die 104 through the via 110 and the conductive pattern 104*e*. In some embodiments, the conductive line 114*a* is disposed between the seed layer pattern 112*a* and the via 116*a*, and the conductive line 114*a* has the sidewall flush with the sidewall of the seed layer pattern 112*a*.

Figure 1E:
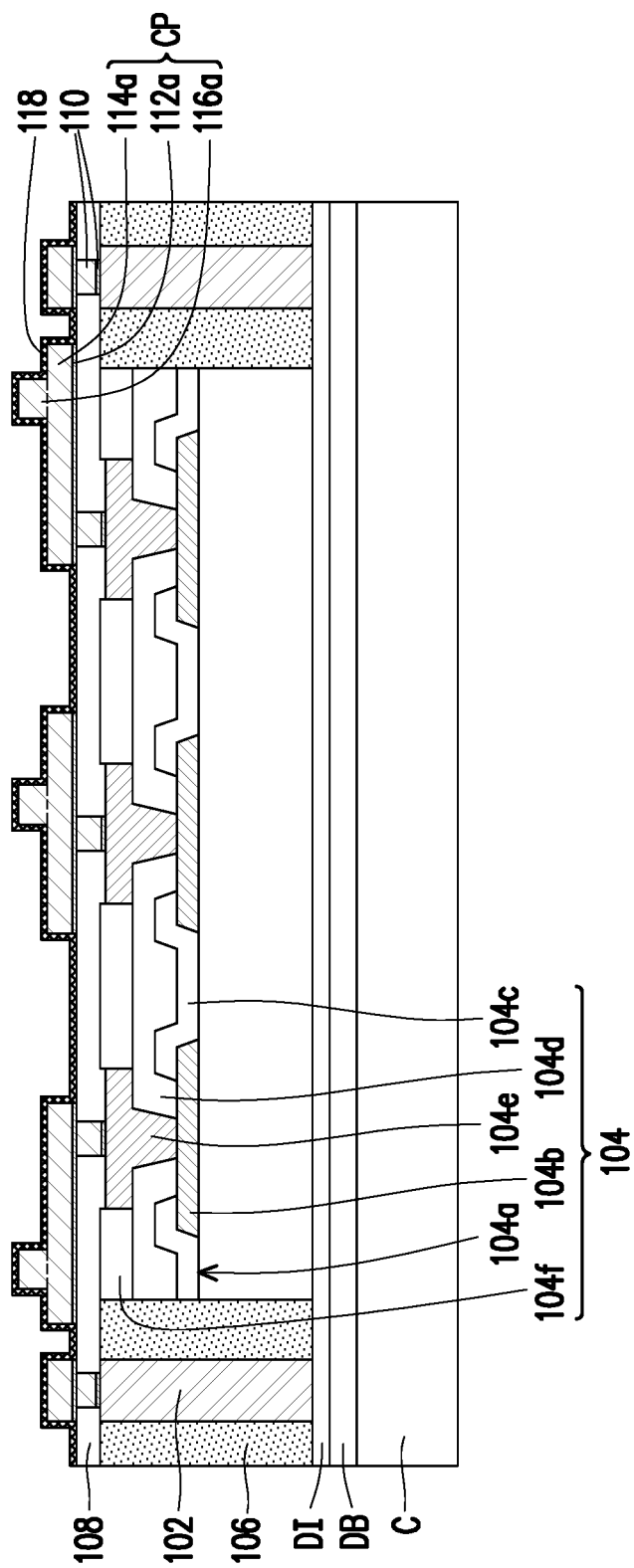

Referring to FIG. 1E, a barrier layer 118 is formed over exposed surfaces of the conductive patterns CP. In some embodiments, the barrier layer 118 is conformally formed over the conductive patterns CP. In some embodiments, the barrier layer 118 is formed on and in contact with the sidewall surface of the seed layer pattern 112*a* and the sidewall surfaces and the top surfaces of the conductive line 114*a* and the via 116*a*. In some embodiments, the barrier layer 118 further extends onto the top surface of the dielectric layer 108 between the conductive patterns CP. In some embodiments, a material of the barrier layer 118 includes silicon nitride (SiN), aluminum oxide ($Al_xO_y$), aluminum silicon nitride ($Al_xSiN_y$), a combination thereof or other suitable isolation material. In some embodiments, a thickness of the barrier layer 118 ranges from 30 angstroms to 4000 angstroms, for example. In some embodiments, the barrier layer 118 includes silicon nitride and has a thickness of 500 angstroms to 4000 angstroms, for example. In some embodiments, the barrier layer 118 includes aluminum oxide and has a thickness of 30 angstroms to 1000 angstroms, for example. In some embodiments, the barrier layer 118 includes aluminum silicon nitride and has a thickness of 30 angstroms to 1000 angstroms, for example. In some embodiments, a forming method of the barrier layer 118 includes a deposition method such as chemical vapor deposition, physical vapor deposition, atomic layer deposition or other applicable method.

Figure 1F:
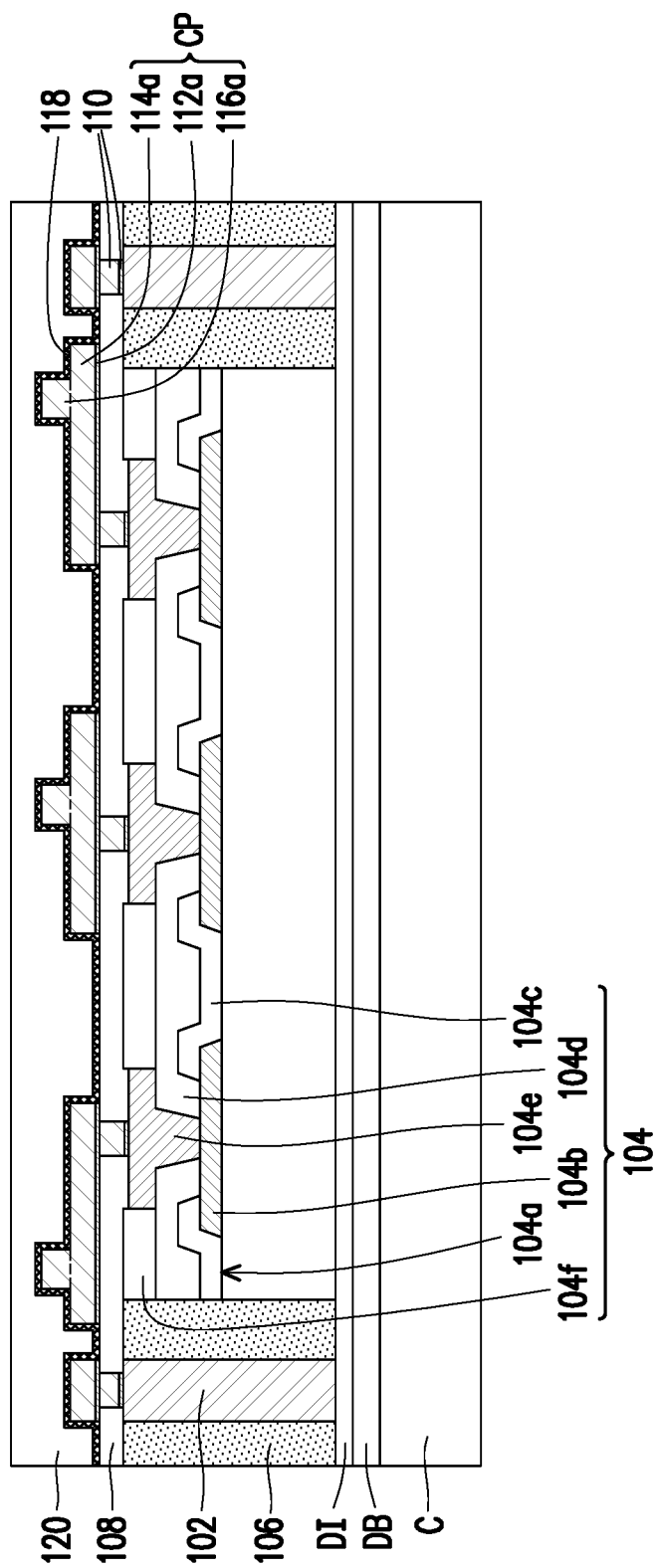

Referring to FIG. 1F, a dielectric layer 120 is formed over the dielectric layer 108 to cover the barrier layer 118 and the conductive patterns CP. In some embodiments, the dielectric layer 120 is a single-layer dielectric, for example. A material of the dielectric layer 120 may be a polybenzoxazole (PBO) layer, a polyimide (PI) layer or other suitable polymers. In some alternative embodiments, the dielectric layer 120 may be made of an inorganic material. In some embodiments, a forming method of the dielectric layer 120 includes a coating method and a curing method, for example.

Figure 1G:
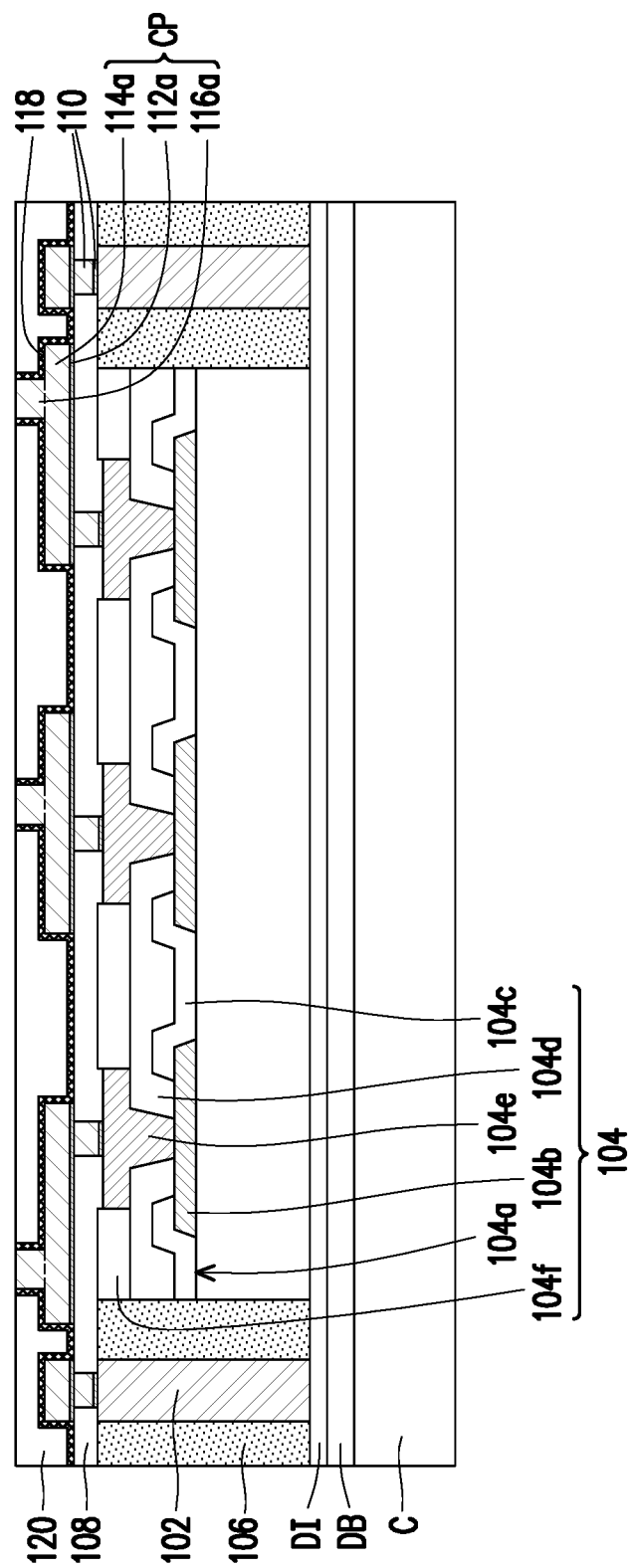

Referring to FIG. 1G, portions of the dielectric layer 120 and the barrier layer 118 are removed to expose the conductive patterns CP. In some embodiments, by using the top surfaces of the vias 116*a* of the conductive patterns CP as a stop layer, a planarization process is performed on the dielectric layer 120 and the barrier layer 118. Then, the top surfaces of the vias 116*a* of the conductive patterns CP are exposed. In some embodiments, the planarization process is a chemical mechanical polishing (CMP) process, for example. In some embodiments, the top surfaces of the barrier layer 118, the vias 116*a* of the conductive patterns CP and the dielectric layer 120 are substantially coplanar, for example. In some alternative embodiments, during the removal process of the dielectric layer 120 and the barrier layer 118, the top surface portions of the vias 116*a* of the conductive patterns CP may be also partially removed.

In some embodiments, the barrier layer 118 is formed on the surface of the conductive pattern CP and disposed at the interface between the dielectric layer 120 and the conductive pattern CP and the interface between the dielectric layers 108, 120. The barrier layer 118 is in contact with the dielectric layer 120 and the conductive pattern CP and exposes a portion of the top surface of the conductive pattern CP. Since the surface of the conductive pattern CP is protected by the barrier layer 118, in the subsequent tests such as thermal tests or stress migration tests, the surface of the conductive pattern CP may be prevented from being oxidized, and the formation of metal oxide layer (i.e., migration of the metal atoms in the conductive pattern CP) such as copper oxide on the surface of the conductive pattern CP may be avoided. Accordingly, the voids causing by the formation of the metal oxide layer and the increased resistance of the conductive pattern CP due to the thick oxide layer may be avoided.

Figure 1H:
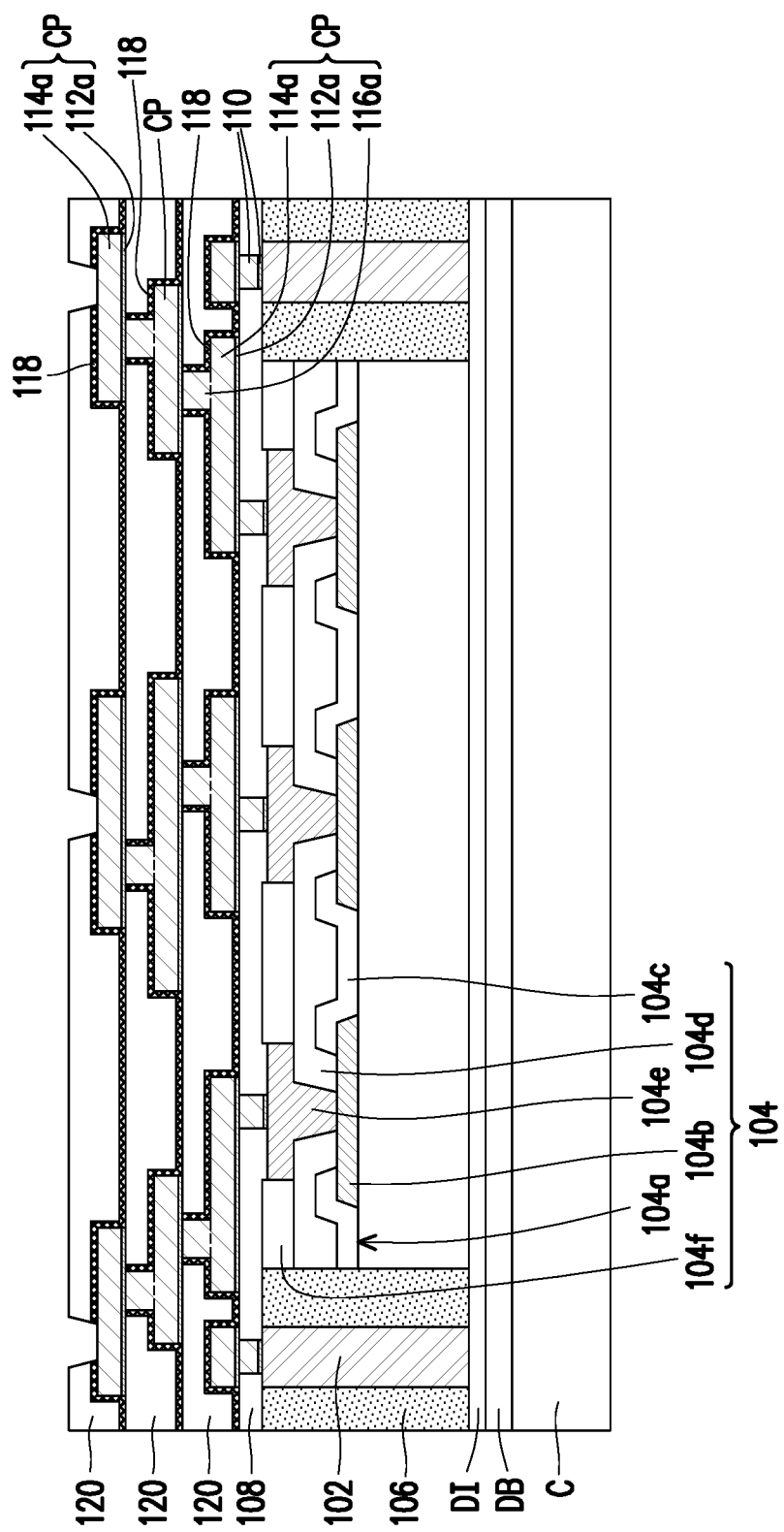
Figure 11:
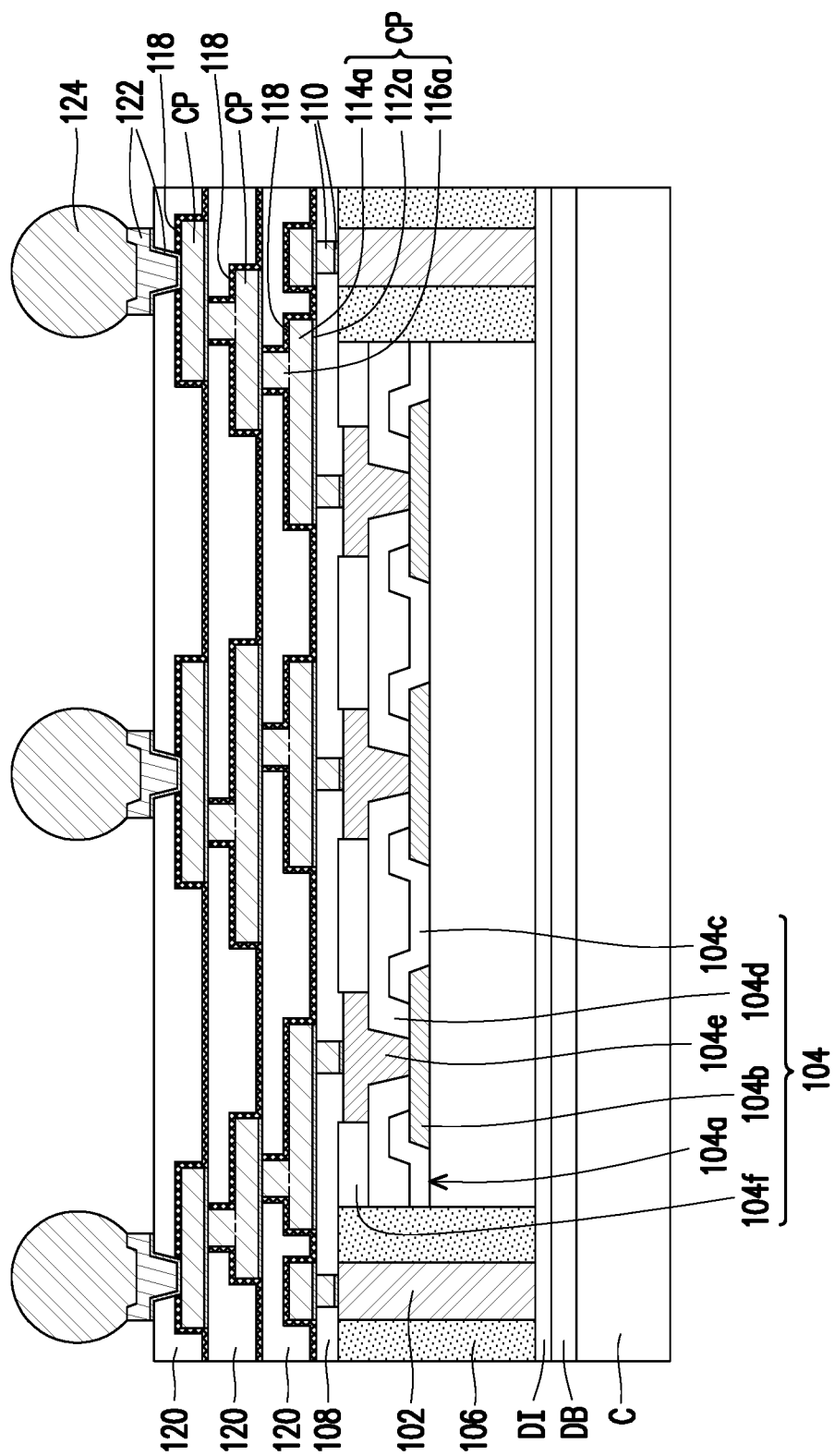

Referring to FIG. 1H, after forming the conductive pattern CP, a plurality of conductive patterns CP electrically connected to the die 104 and a plurality of dielectric layers 120 may be sequentially formed over the die 104, so as to form a redistribution circuit structure. In some embodiments, the conductive patterns CP may have configuration the same as, similar to or different from the conductive patterns CP of FIG. 1H. However, at least one conductive pattern CP of the redistribution circuit structure is covered by the barrier layer 118. In some embodiments, the topmost conductive patterns CP are formed without vias 116*a*, that is, the topmost conductive patterns CP include seed layer patterns 112*a* and conductive lines 114*a*. Then, the topmost barrier layer 118 and the topmost dielectric layer 120 are sequentially formed to cover the top surfaces of the topmost conductive patterns CP. After that, portions of the topmost dielectric layer 120 and the barrier layer 118 covering portions of top surfaces of the topmost conductive patterns CP are removed to expose the topmost conductive patterns CP. In some embodiments, the portions of the dielectric layer 120 and the barrier layer 118 may be removed simultaneously or sequentially.

Referring to FIG. 1I, after the topmost conductive patterns CP and the topmost dielectric layer 120 are formed, a plurality of under-ball metallurgy patterns 122 are formed on and in the topmost dielectric layer 120, to electrically connect the topmost conductive patterns CP respectively. In some embodiments, the bottom of the under-ball metallurgy patterns 122 is in contact with the barrier layer 118, for example. In some embodiments, the under-ball metallurgy pattern 122 includes a seed layer pattern and a metal layer pattern on the seed layer pattern, for example. Then, a plurality of conductive terminals 124 are placed on the under-ball metallurgy patterns 122 respectively. In some embodiments, the conductive terminals 124 may be placed on the under-ball metallurgy patterns 122 through a ball placement process or other suitable processes. In some alternative embodiments, at least one passive component or other suitable component may be mounted on and electrically connected to the redistribution circuit structure through a micro-bump, for example.

Figure 1J:
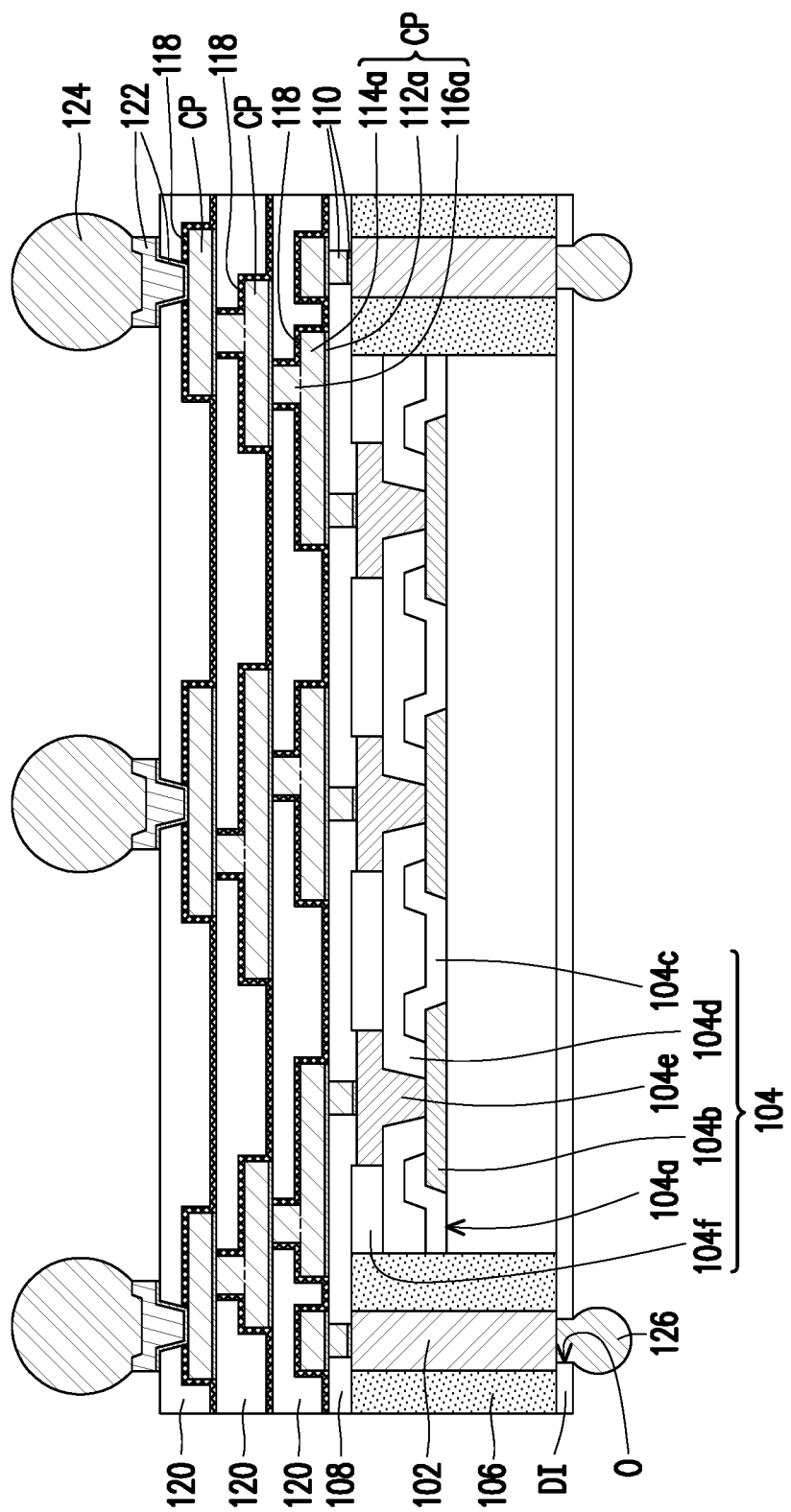

Referring to FIG. 1J, the dielectric layer DI formed on the bottom surface of the encapsulant 106 is de-bonded from the de-bonding layer DB such that the dielectric layer DI is separated from the carrier C. That is, the carrier C is removed. In some embodiments, the de-bonding layer DB (e.g., the LTHC release layer) may be irradiated by an UV laser such that the dielectric layer DI adhered on the bottom surface of the encapsulant 106 is peeled from the carrier C. As illustrated in FIG. 1J, the dielectric layer DI is then patterned such that a plurality of contact openings O is formed to partially expose the conductive posts 102. The number of the contact openings O corresponds to the number of the conductive posts 102. In some embodiments, the contact openings O of the dielectric layer DI are formed by a laser drilling process, a mechanical drilling process, or other suitable processes.

After the contact openings O are formed in the dielectric layer DI, a plurality of conductive terminals 126 are placed in the contact openings O, and the conductive terminals 126 are electrically connected to the conductive posts 102. Herein, a semiconductor package such as an integrated fan-out (INFO) package is substantially completed. In some alternative embodiments, after the conductive terminals 124, 126 are formed, the package array is diced to form a plurality of packages having dual-side terminal design. In some alternative embodiments, the dicing process or singulation process typically involves dicing with a rotating blade or a laser beam. In other words, the dicing or singulation process is, for example, a laser cutting process, a mechanical cutting process, or other suitable processes. In some alternative embodiments, the package may be stack with other electronic devices such as an IC package, an INFO package, a memory device, a ball grid array (BGA), or a wafer. Furthermore, the stacking may be performed preceding the dicing process. For example, in some alternative embodiments, the formed package array may be stacked with a wafer, and the singulation process may be performed on the stacked package array and the wafer simultaneously. In some embodiments, the conductive posts 102 are formed aside the die 104. However, the disclosure is not limited thereto. In some alternative embodiments, the conductive posts 102 and thus the conductive terminals 126 may be omitted. In other words, the die 104 may be encapsulated by the encapsulant 106 without the conductive posts 102 therethrough.

Figure 2:
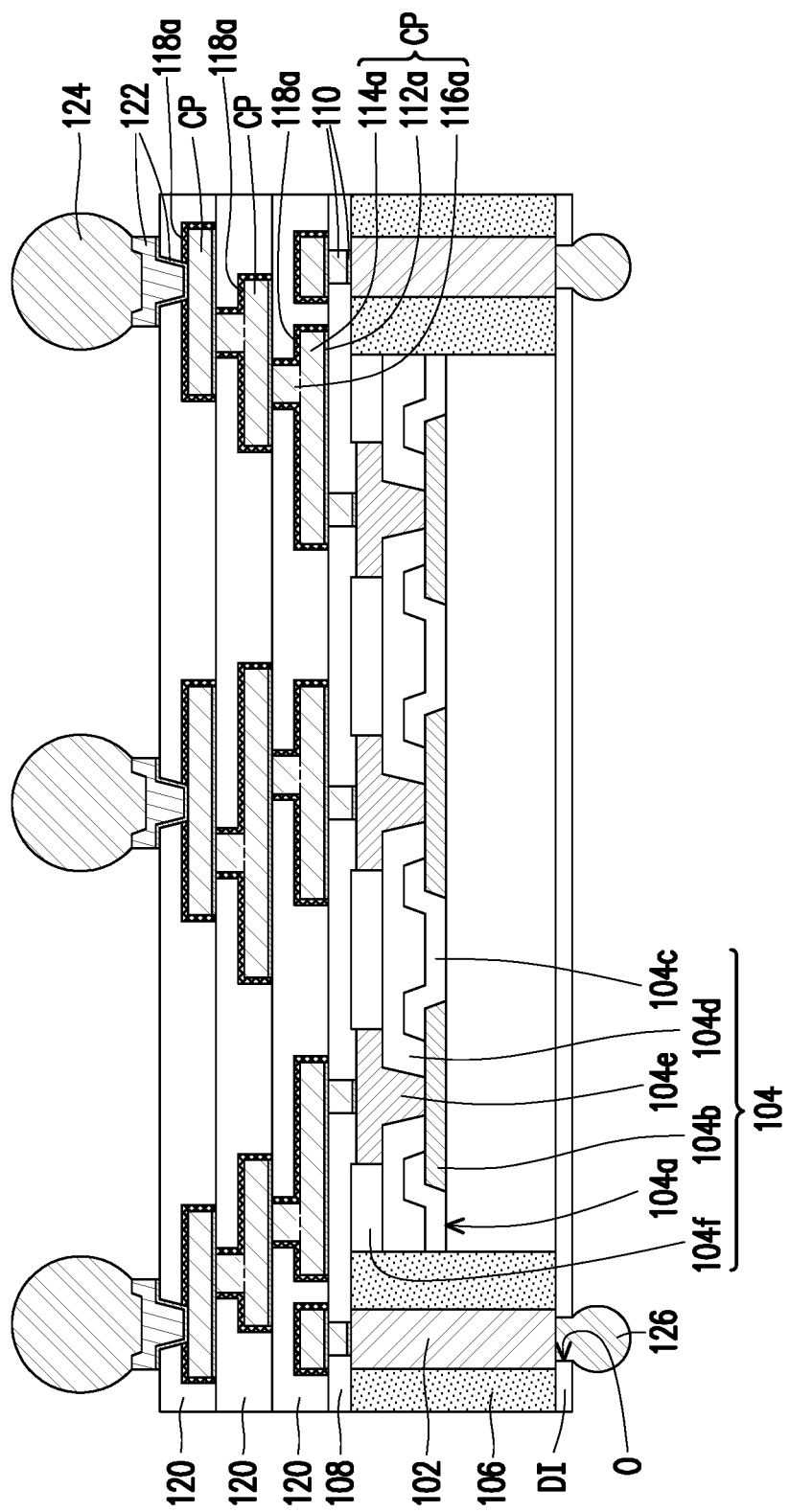
FIG. 2 is a schematic cross-sectional view illustrating a semiconductor package in accordance with some embodiments of the disclosure.

In some embodiments, the barrier layer 118 is extended onto the top surface of the underlying dielectric layer 108, 120. However, the disclosure is not limited thereto. In some alternative embodiments, as shown in FIG. 2, the barrier layer 118a is merely formed on the surface of the conductive pattern CP, and is not extended onto the top surface of the dielectric layer 108, 120. In some alternative embodiments, the barrier layer 126 may be directly deposited on the surface of the conductive pattern CP by ALD process, for example. In addition, in some alternative embodiments, the barrier layer 118, 118a may be not continuously formed on the surfaces of the conductive pattern CP or not continuously formed on the surfaces of the conductive pattern CP and the top surface of the underlying dielectric layer 108, 120.

Figure 3A:
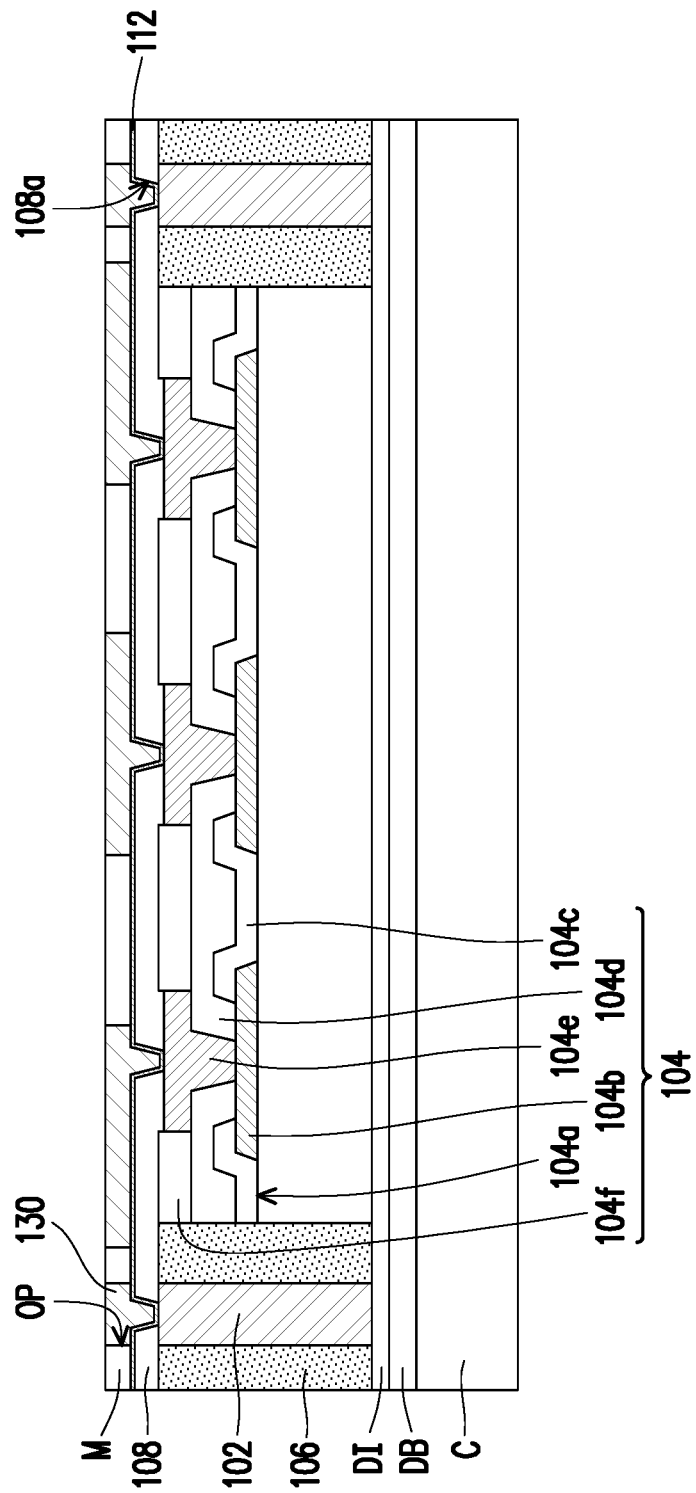
FIGS. 3A-3E are schematic cross-sectional views illustrating a manufacturing process of a semiconductor package in accordance with some embodiments of the disclosure.

FIG. 3A-3E are schematic cross-sectional views illustrating a method of manufacturing a semiconductor package in accordance with some embodiments of the disclosure. The method of FIGS. 3A-3E is similar to the method of FIGS. 1A-1J. The elements similar to or substantially the same as the elements described previously will use the same reference numbers, and certain details or descriptions of the same elements may not be repeated herein. Referring to FIG. 3A, a structure is provided, and the structure includes a plurality of conductive posts 102 and a die 104 encapsulated by an encapsulant 106. Then, a dielectric layer 108 of a redistribution circuit structure is formed over the die 104 and the encapsulant 106, and a plurality of openings 108a are formed in the dielectric layer 108 to expose conductive patterns 104e of the die 104. In some embodiments, a seed layer 112 is conformally formed over the dielectric layer 108. Then, a mask M is formed over the dielectric layer 108, and the mask M is patterned to have a plurality of openings OP corresponding to the openings 108a. A conductive material 130 is filled into the openings OP of the mask M.

Figure 3B:
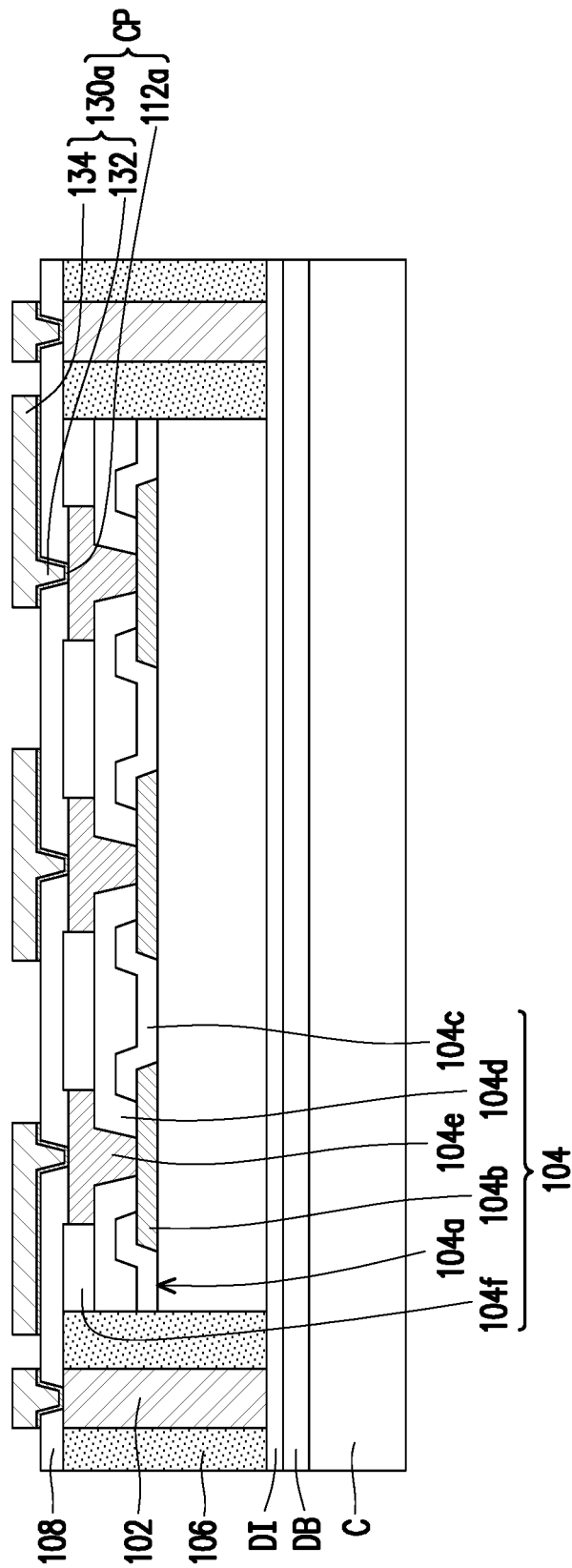

Referring to FIG. 3B, the mask M is subsequently removed to render a plurality of conductive patterns 130a, and portions of the seed layer 112 exposed by the conductive patterns 130a are selectively removed to render a plurality of seed layer patterns 112a. Then, a plurality of conductive patterns CP serving as the redistribution patterns are formed. In some embodiments, the conductive pattern 130a includes a via 132 and a conductive line 134 on the via 132, and the via 132 and the conductive line 134 are integrally formed. In some embodiments, the conductive pattern CP serving as the redistribution pattern includes the seed layer pattern 112a and the conductive pattern 130a including the via 132 and the conductive line 134.

Figure 3C:
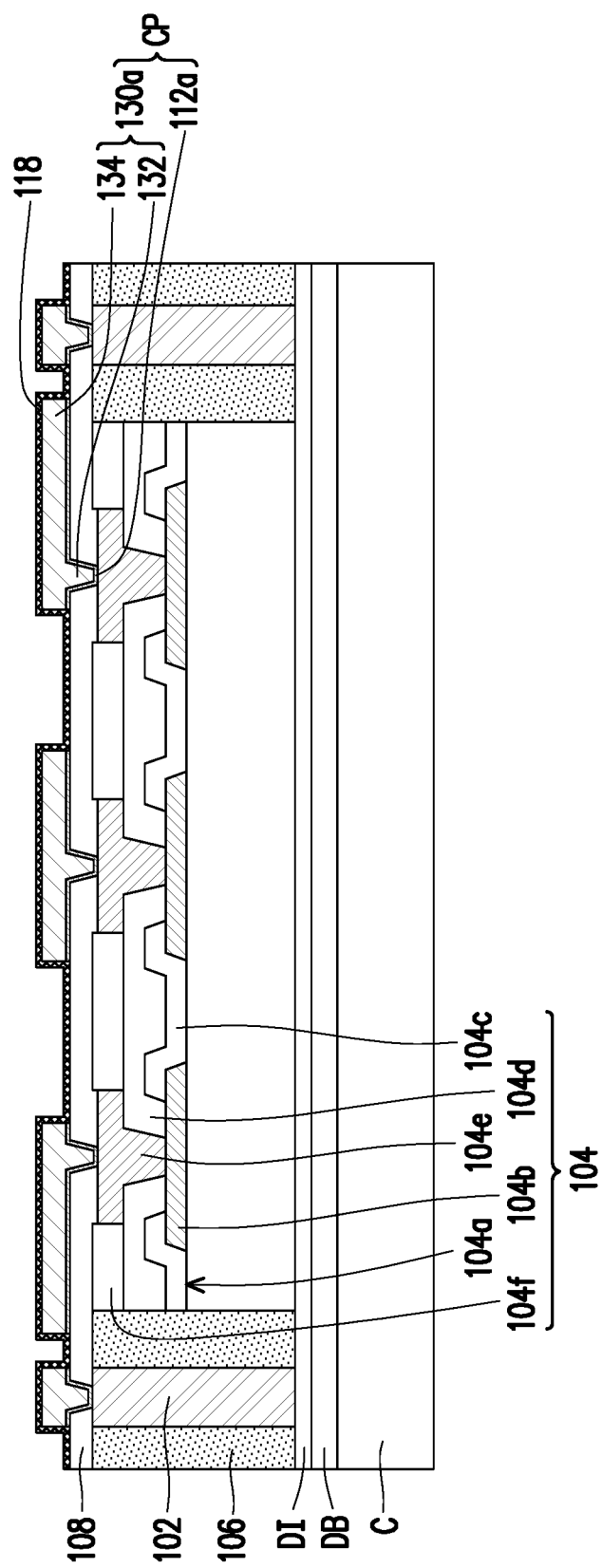

Referring to FIG. 3C, a barrier layer 118 is formed over exposed surfaces of the conductive patterns CP. In some embodiments, the barrier layer 118 is conformally formed over the conductive patterns CP. In some embodiments, the barrier layer 118 is formed on and in contact with the sidewall surface of the seed layer pattern 112a and the sidewall surfaces and the top surfaces of the conductive line 134. In some embodiments, the barrier layer 118 further extends onto the top surface of the dielectric layer 108 between the conductive patterns CP.

Figure 3D:
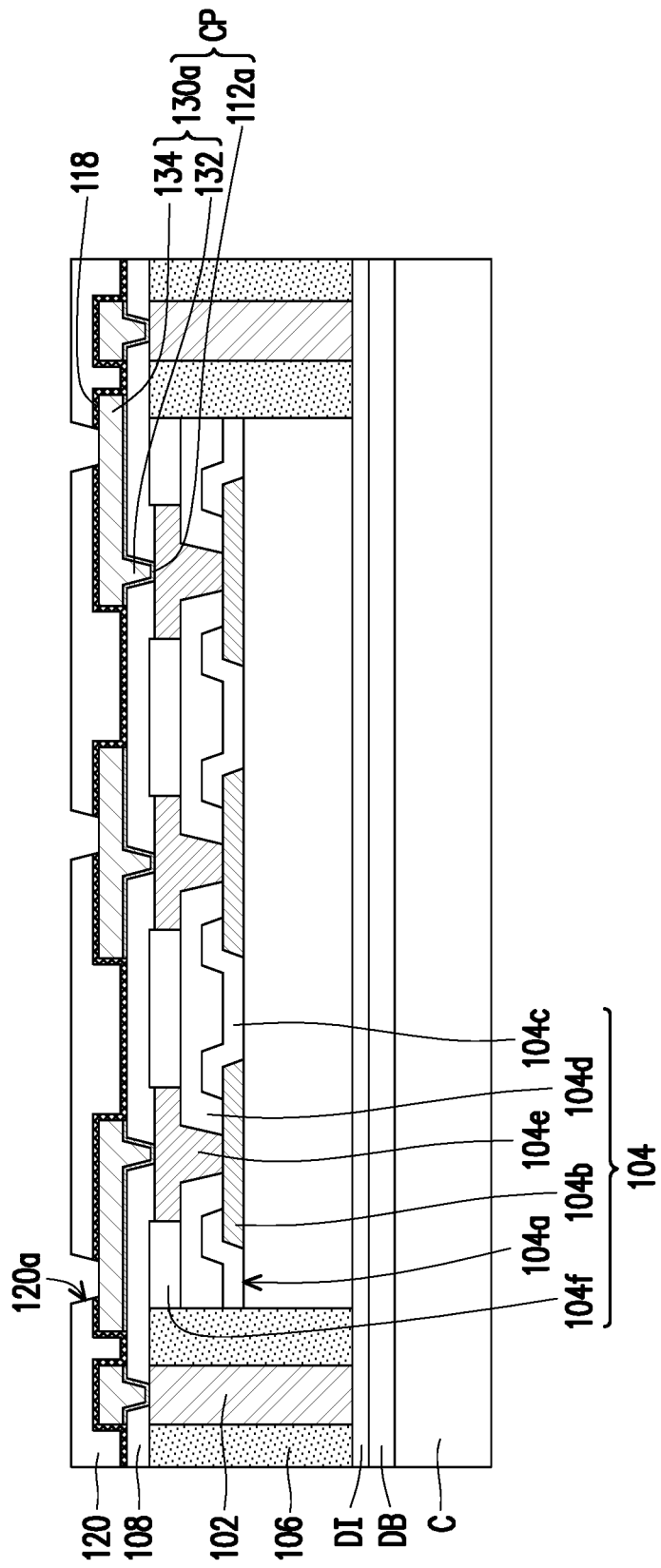

Referring to FIG. 3D, a dielectric layer 120 is formed over the dielectric layer 108, and the dielectric layer 120 has a plurality of openings 120a to expose the conductive patterns CP respectively. In some embodiments, first, the dielectric layer 120 is formed over the dielectric layer 108 to cover the barrier layer 118 and the conductive patterns CP. Then, portions of the dielectric layer 120 and the barrier layer 118 are removed to expose the conductive patterns CP. In other words, the barrier layer 118 covering portions of the top surfaces of the conductive patterns CP are removed. In some embodiments, the portions of the dielectric layer 120 and the barrier layer 118 may be removed simultaneously or sequentially.

In some embodiments, the barrier layer 118 is formed on the surface of the conductive pattern CP and disposed at the interface between the dielectric layer 120 and the conductive pattern CP and the interface between the dielectric layers 108, 120. The barrier layer 118 is in contact with the dielectric layer 120 and the conductive pattern CP and exposes a portion of the top surface of the conductive pattern CP. Since the surface of the conductive pattern CP is protected by the barrier layer 118, in the subsequent tests such as thermal tests or stress migration tests, the surface of the conductive pattern CP may be prevented from being oxidized, and the formation of metal oxide layer (i.e., migration of the metal atoms in the conductive pattern CP) such as copper oxide on the surface of the conductive pattern CP may be avoided. Accordingly, the voids causing by the formation of the metal oxide layer and the increased resistance of the conductive pattern CP due to the thick oxide layer may be avoided.

Figure 3E:
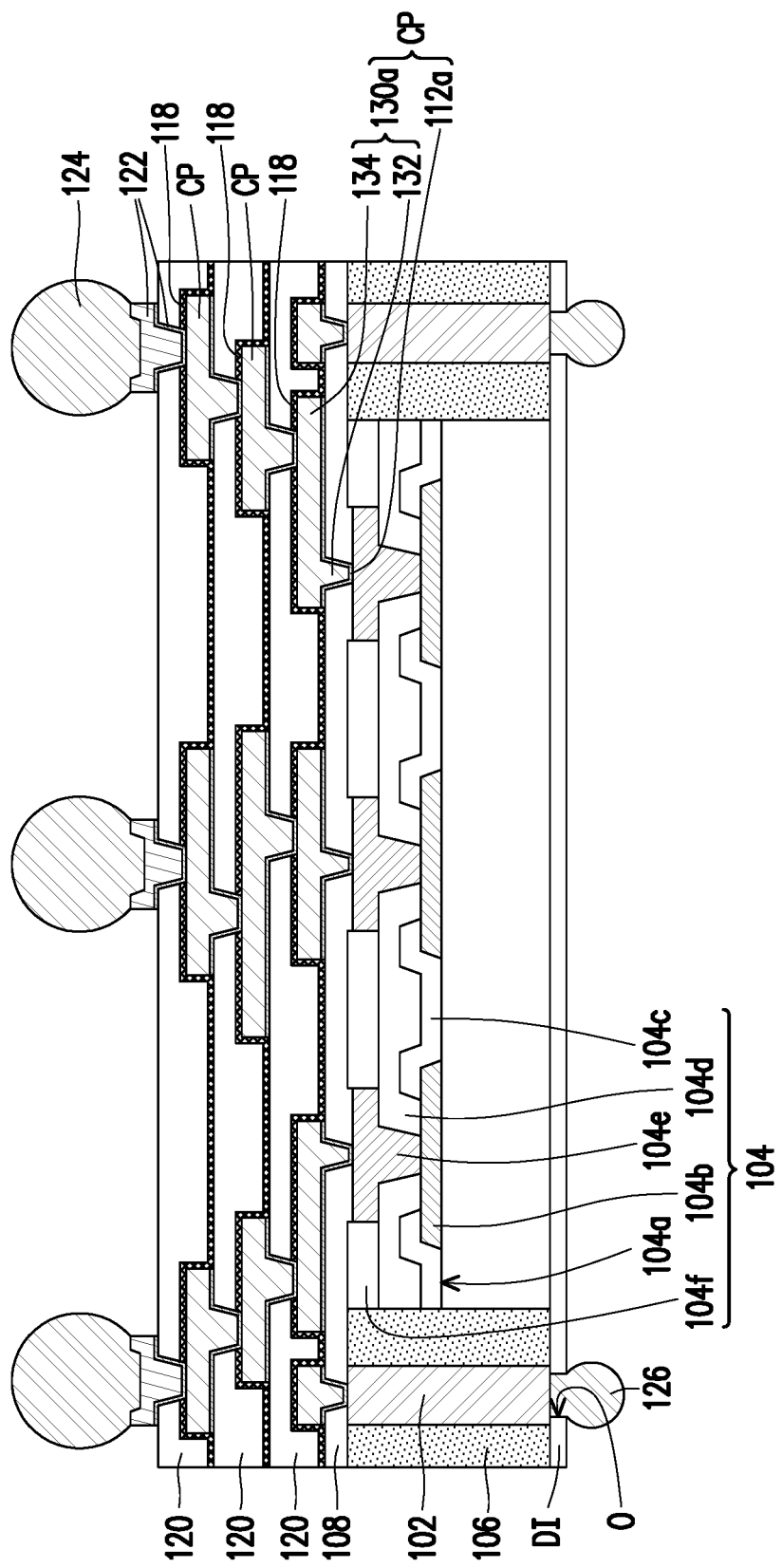

Referring to FIG. 3E, after forming the conductive pattern CP, a plurality of conductive patterns CP electrically connected to the die 104 and a plurality of dielectric layers 120 may be sequentially formed over the die 104, so as to form a redistribution circuit structure. In some embodiments, the conductive patterns CP may have configuration the same as, similar to or different from the conductive patterns CP of FIG. 3D. However, at least one conductive pattern CP of the redistribution circuit structure is covered by the barrier layer 118. After the topmost conductive patterns CP and the topmost dielectric layer 120 are formed, a plurality of under-ball metallurgy patterns 122 are formed on and in the topmost dielectric layer 120, to electrically connect the topmost conductive patterns CP respectively. In some embodiments, the bottom of the under-ball metallurgy patterns 122 is in contact with the barrier layer 118, for example. In some embodiments, the under-ball metallurgy pattern 122 includes a seed layer pattern and a metal layer pattern on the seed layer pattern, for example. Then, a plurality of conductive terminals 124 are placed on the under-ball metallurgy patterns 122 respectively.

After that, the dielectric layer DI is de-bonded from the de-bonding layer DB such that the dielectric layer DI is separated from the carrier C. Then, the dielectric layer DI is patterned to form a plurality of contact openings O, so as to partially expose the conductive posts 102. After the contact openings O are formed in the dielectric layer DI, a plurality of conductive terminals 126 are placed in the contact openings O, and the conductive terminals 126 are electrically connected to the conductive posts 102.

Figure 4:
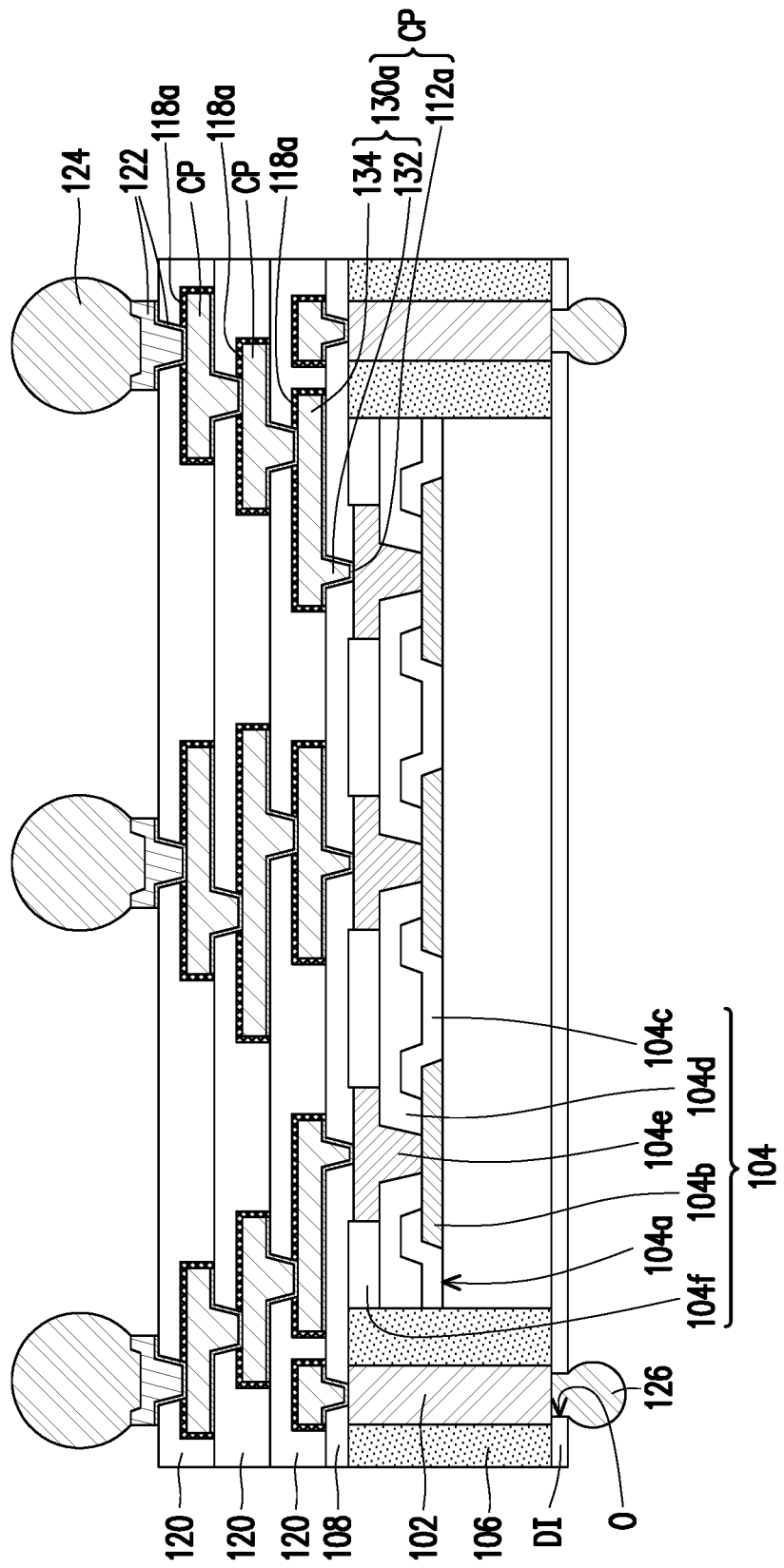
FIG. 4 is a schematic cross-sectional view illustrating a semiconductor package in accordance with some embodiments of the disclosure.

In some embodiments, the barrier layer 118 is extended onto the top surface of the underlying dielectric layer 108, 120. However, the disclosure is not limited thereto. In some alternative embodiments, as shown in FIG. 4, the barrier layer 118a is merely formed on the surface of the conductive pattern CP, and is not extended onto the top surface of the dielectric layer 108, 120. In some alternative embodiments, the barrier layer 126 may be directly deposited on the exposed surface of the conductive pattern CP (i.e., the sidewall surfaces of the seed layer pattern 112a and the conductive line 134 and the top surface of the conductive line 134) by ALD process, for example, and then be partially removed to expose a top portion of the conductive pattern CP (i.e., the top surface of the conductive line 134, for example). In addition, in some alternative embodiments, the barrier layer 118, 118a may be not continuously formed on the surfaces of the conductive pattern CP or not continuously formed on the surfaces of the conductive pattern CP and the top surface of the underlying dielectric layer 108, 120.

In some embodiments, the barrier layer (also referred to as the isolation cap structure) is disposed on the surface of the conductive pattern at the interface between the dielectric layer and the conductive pattern. In addition, the barrier layer may be further extended onto the dielectric layer underlying the conductive pattern and at the interface between the adjacent two dielectric layers. Since the surface of the conductive pattern is protected by the barrier layer, in the subsequent tests such as thermal tests or stress migration tests, the surface of the conductive pattern may be prevented from being oxidized, and the formation of metal oxide layer such copper oxide on the surface of the conductive pattern may be avoided. Accordingly, the resistance of the conductive pattern will not be increased due to the thick oxide layer formed thereon. Therefore, the semiconductor package may have an improved performance.

In accordance with some embodiments of the present disclosure, a semiconductor package includes a first dielectric layer, a first conductive pattern and a barrier layer. The first conductive pattern is disposed in a second dielectric layer over the first dielectric layer. The barrier layer is disposed at an interface between the first conductive pattern and the second dielectric layer and an interface between the first dielectric layer and the second dielectric layer.

In accordance with alternative embodiments of the present disclosure, a semiconductor package includes a die, a conductive pattern and a barrier layer. The die comprises a pad thereon. The conductive pattern is disposed over and electrically connected to the pad and includes a conductive line and a via. The barrier layer at least covers a top surface and a sidewall surface of the conductive line.

In accordance with yet alternative embodiments of the present disclosure, a method of manufacturing a semiconductor package includes the following steps. A first dielectric layer is formed over a die, wherein the die comprises a pad thereon. A conductive pattern is formed on the first dielectric layer. A barrier layer is conformally formed on an exposed surface of the conductive pattern. A second dielectric layer is formed to cover the barrier layer and the conductive pattern. Portions of the barrier layer and the second dielectric layer are removed to expose the conductive pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a die comprising a pad thereon;
   a conductive pattern disposed over and electrically connected to the pad, and comprising a conductive line and a via disposed between the pad and the conductive line and integrally formed with the conductive line;
   a seed layer pattern, surrounding the via without covering a sidewall surface of the conductive line; and
   a barrier layer at least covering a top surface and the sidewall surface of the conductive line, wherein the conductive line is disposed on a first dielectric layer in which the via is disposed, and the barrier layer is extended onto a top surface of the first dielectric layer.

2. The semiconductor package of claim 1, wherein a material of the barrier layer comprises silicon nitride, aluminum oxide, aluminum silicon nitride or a combination thereof.

3. The semiconductor package of claim 1, wherein the seed layer is further disposed at a bottom surface of the conductive line, and the barrier layer further covers a sidewall surface of a portion of the seed layer pattern at the bottom surface of the conductive line.

4. The semiconductor package of claim 1, wherein the conductive line is disposed in a second dielectric layer over the first dielectric layer, and a top surface of the second dielectric layer is higher than the top surface of the conductive line.

5. The semiconductor package of claim 1, wherein the barrier layer is in direct contact with the sidewall surface of the conductive line.

6. The semiconductor package of claim 1, wherein a portion of the barrier layer covering the top surface of the conductive line is integrally formed with a portion of the barrier layer covering the sidewall surface of the conductive line.

7. The semiconductor package of claim 1, wherein a portion of the barrier layer covering the top surface of the conductive line is integrally formed with a portion of the barrier layer covering the sidewall surface of the conductive line and a portion of the barrier layer extended onto the top surface of the first dielectric layer.

8. A method of manufacturing a semiconductor package, comprising:
    forming a first dielectric layer over a die, wherein the die comprises a pad thereon;
    forming a first opening in the first dielectric layer;
    forming a seed layer over the first dielectric layer;
    forming a first mask having a second opening onto the seed layer, wherein the second opening exposes a portion of the seed layer;
    forming the conductive material in the first opening and the second opening to form a via in the first opening and a conductive line in the second opening,
    wherein a conductive pattern comprises the via and the conductive line disposed on and electrically connected to the via;
    removing the first mask;
    conformally forming a barrier layer on an exposed surface of the conductive pattern;
    forming a second dielectric layer to cover the barrier layer and the conductive pattern; and
    removing portions of the barrier layer and the second dielectric layer, to expose the conductive pattern.

9. The method of claim 8, wherein the barrier layer is further formed on a top surface of the first dielectric layer.

10. The method of claim 8, wherein the steps of forming the barrier layer and the second dielectric layer and removing portions of the barrier layer and the second dielectric layer comprise:
    forming the barrier layer on a sidewall surface and a top surface of the conductive line;
    forming the second dielectric layer over the conductive pattern, wherein the second dielectric layer has a second opening exposing a portion of the barrier layer on the top surface of the conductive line; and
    removing the portion of the barrier layer, to expose the top surface of the conductive line.

11. A semiconductor package, comprising:
    a die comprising a pad thereon;
    a first conductive pattern disposed over and electrically connected to the pad, and comprising a via and a conductive line between the pad and the via; and
    a barrier layer at least comprising a first portion covering a top surface of the conductive line, a second portion covering a sidewall surface of the conductive line and a third portion covering a sidewall of the via, wherein the first portion is integrally formed with the second portion.

12. The semiconductor package of claim 11 further comprising a first dielectric layer aside the via and the conductive line, wherein the barrier layer further comprises a fourth portion extending under the first dielectric layer.

13. The semiconductor package of claim 12, wherein the fourth portion is integrally formed with the second portion.

14. The semiconductor package of claim 12, wherein a top surface of the first dielectric layer is substantially flush with a top surface of the via.

15. The semiconductor package of claim 12, wherein the first portion and the second portion are in direct contact with the first dielectric layer.

16. The semiconductor package of claim 11, wherein the first portion is in direct contact with the top surface of the conductive line and the second portion is in direct contact with the sidewall surface of the conductive line.

17. The semiconductor package of claim 11 further comprising a second conductive pattern aside the first conductive pattern, wherein the barrier layer is continuously disposed between the first conductive pattern and the second conductive pattern.

18. The semiconductor package of claim 11, wherein the first conductive pattern further comprises a seed layer pattern under the via and the conductive line, and the second portion further covers a sidewall surface of the seed layer pattern.

19. The semiconductor package of claim 11, wherein the third portion is integrally formed with the second portion.

20. The semiconductor package of claim 11, wherein the third portion is integrally formed with the first portion and the second portion.

* * * * *